United States Patent
DeBrosse et al.

(10) Patent No.: US 7,535,783 B2
(45) Date of Patent: May 19, 2009

(54) APPARATUS AND METHOD FOR IMPLEMENTING PRECISE SENSING OF PCRAM DEVICES

(75) Inventors: John K. DeBrosse, Colchester, VT (US); Thomas M. Maffitt, Burlington, VT (US); Mark C. H. Lamorey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 11/865,134

(22) Filed: Oct. 1, 2007

(65) Prior Publication Data

US 2009/0086534 A1 Apr. 2, 2009

(51) Int. Cl.
*G11C 7/02* (2006.01)
(52) U.S. Cl. .................. 365/208; 365/207; 365/209
(58) Field of Classification Search ............. 365/208
See application file for complete search history.

(56) References Cited

U.S. PATENT DOCUMENTS

| | | | | |
|---|---|---|---|---|
| 6,191,989 | B1 * | 2/2001 | Luk et al. | 365/207 |
| 6,600,690 | B1 * | 7/2003 | Nahas et al. | 365/189.09 |
| 6,700,814 | B1 * | 3/2004 | Nahas et al. | 365/158 |
| 6,982,908 | B2 * | 1/2006 | Cho | 365/158 |
| 7,099,180 | B1 | 8/2006 | Dodge et al. | |
| 7,161,861 | B2 * | 1/2007 | Gogl et al. | 365/207 |
| 7,260,004 | B2 * | 8/2007 | Lamorey et al. | 365/201 |
| 7,423,476 | B2 * | 9/2008 | Tang | 327/543 |
| 2001/0003507 | A1 * | 6/2001 | Maruyama et al. | 365/185.2 |
| 2005/0259471 | A1 * | 11/2005 | Kuo | 365/185.21 |
| 2005/0281073 | A1 | 12/2005 | Cho et al. | |
| 2006/0002172 | A1 | 1/2006 | Venkataraman et al. | |
| 2006/0092689 | A1 * | 5/2006 | Braun et al. | 365/158 |
| 2006/0158922 | A1 | 7/2006 | Takemura | |
| 2006/0221678 | A1 | 10/2006 | Bedeschi et al. | |
| 2006/0227590 | A1 | 10/2006 | Parkinson | |
| 2008/0192555 | A1 * | 8/2008 | Fort | 365/207 |

OTHER PUBLICATIONS

T. W. Andre et al.; "A 4-Mb 0.18um 1T1MTJ Toggle MRAM with Balanced Three Input Sensing Scheme and Locally Mirrored Unidirectional Write Drivers;" IEEE Journal of Solid-State Circuits, vol. 40, No. 1, Jan. 2005; pp. 301-309.
J. DeBrosse et al.; "A 16Mb MRAM Featuring Bootstrapped Write Drivers;" 2004 Symposium of VLSI Circuits Digest of Technical Papers; IEEE 2004; pp. 454-457.

* cited by examiner

*Primary Examiner*—Son L Mai
(74) *Attorney, Agent, or Firm*—Cantor Colburn LLP; Michael LeStrange

(57) ABSTRACT

A precision sense amplifier apparatus includes a current source configured to introduce an adjustable reference current through a reference leg; a current mirror configured to mirror the reference current to a data leg, the data leg selectively coupled to a programmable resistance memory element; an active clamping device coupled to the data leg, and configured to clamp a fixed voltage across the memory element, thereby establishing a fixed current sinking capability thereof; and a differential sense amplifier having a first input thereof coupled to the data leg and a second input thereof coupled to the reference leg; wherein an output of the differential sense amplifier assumes a first logic state whenever the reference current is less than the fixed current sinking capability of the memory element, and assumes a second logic state whenever the reference current exceeds the fixed current sinking capability.

21 Claims, 3 Drawing Sheets

APPARATUS AND METHOD FOR IMPLEMENTING PRECISE SENSING OF PCRAM DEVICES

BACKGROUND

The present invention relates generally to integrated circuit memory devices and, more particularly, to an apparatus and method for implementing precise sensing of phase-change random access memory (PCRAM) devices.

Dynamic Random Access Memory (DRAM) integrated circuit arrays have been in existence for several years, with their dramatic increase in storage capacity having been achieved through advances in semiconductor fabrication technology and circuit design technology. The considerable advances in these two technologies have also resulted in higher and higher levels of integration that permit dramatic reductions in memory array size and cost, as well as increased process yield.

A DRAM memory cell typically includes, as basic components, an access transistor (switch) and a capacitor for storing a binary data bit in the form of a charge. Typically, a first voltage is stored on the capacitor to represent a logic HIGH or binary "1" value (e.g., $V_{DD}$), while a second voltage on the storage capacitor represents a logic LOW or binary "0" value (e.g., ground). A basic drawback of a DRAM device is that the charge on the capacitor eventually leaks away and therefore provisions must be made to "refresh" the capacitor charge, otherwise the data bit stored by the memory cell is lost.

The memory cell of a conventional Static Random Access Memory (SRAM), on the other hand, includes, as basic components, an access transistor or transistors and a memory element in the form of two or more integrated circuit devices interconnected to function as a bistable latch. An example of such a bistable latch is a pair of cross-coupled inverters. Bistable latches do not need to be "refreshed," as in the case of DRAM memory cells, and will reliably store a data bit indefinitely so long as they continue to receive supply voltage. However, such a memory cell requires a larger number of transistors and therefore a larger amount of silicon real estate than a simple DRAM cell, and draws more power than a DRAM cell. Like a DRAM array, an SRAM array is also a form of volatile memory in that the data is lost once power is removed.

Accordingly, efforts continue to identify other types of memory elements that are capable of storing data states, that do not require extensive refreshing, and that are non-volatile in nature. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store a binary "0" data bit. The stored data bit could then be retrieved by detecting the magnitude of a readout voltage generated when a current is switched through the resistive memory element using an access device.

Phase Change Random Access Memory ("PCRAM" also referred to as "PRAM") is an emerging non-volatile memory technology which stores data using phase change materials (such as Ge—Sb—Te (GST) alloys) having a programmable electrical resistance that changes with temperature. Other compositions such as $GeSb_4$, (including substitution/addition of other elements) are also possible for the phase change materials. Individual phase change elements (PCE) are thus used as the storage cells of a memory device. The state of an individual PCE is programmed through a heating and cooling process which is electrically controlled by passing a current through the PCE (or a discrete heating element in proximity to the PCE) and the resulting ohmic heating that occurs. Depending upon the specific applied temperature and duration of heating applied to the PCE element, the structure is either "set" to a lower resistance crystalline state or "reset" to an amorphous, higher resistance state.

Data is read from a given PCRAM cell by selecting a bit line and a word line for that cell, passing a current through that PCRAM cell, and thereafter distinguishing a "1" from "0" based upon the voltage generated from the variable resistance of the phase change material of the PCRAM cell. Because the resistance of a phase change element may be as low about 1 kΩ or as high as about 10 MΩ, the current must be controlled with precision across a very large range. However, existing current sense schemes either lack the range or precision required for robust phase change element resistance measurement throughout the full resistance range. Accordingly, it would be desirable to be able to implement an improved sensing and resistance measuring technique for phase-change random access memory (PCRAM) devices, as well as for other types of memory devices.

SUMMARY

The foregoing discussed drawbacks and deficiencies of the prior art are overcome or alleviated by a precision sense amplifier apparatus including, in an exemplary embodiment, a current source configured to introduce an adjustable reference current through a reference leg; a current mirror configured to mirror the reference current to a data leg, the data leg selectively coupled to a programmable resistance memory element; an active clamping device coupled to the data leg, and configured to clamp a fixed voltage across the memory element, thereby establishing a fixed current sinking capability thereof; and a differential sense amplifier having a first input thereof coupled to the data leg and a second input thereof coupled to the reference leg; wherein an output of the differential sense amplifier assumes a first logic state whenever the reference current is less than the fixed current sinking capability of the memory element, and assumes a second logic state whenever the reference current exceeds the fixed current sinking capability.

In another embodiment, a precision sense amplifier apparatus for measuring the resistance of a phase change memory (PCM) element includes an adjustable voltage to current input source; a first current mirror coupled to the adjustable voltage to current input source, the first current mirror having a programmable gain; an output impedance stage coupled to the voltage to current input source and a reference leg, the output impedance configured for precise control of an adjustable reference current introduced through a reference leg; a second current mirror configured to mirror the reference current to a data leg, the data leg selectively coupled to the PCM element; an active clamping device coupled to the data leg, and configured to clamp a fixed voltage across the memory element, thereby establishing a fixed current sinking capability thereof; and a differential sense amplifier having a first input thereof coupled to the data leg and a second input thereof coupled to the reference leg; wherein an output of the differential sense amplifier assumes a first logic state whenever the reference current is less than the fixed current sinking capability of the memory element, and assumes a second logic state whenever the reference current exceeds the fixed current sinking capability.

In still another embodiment, a method of determining the resistance of a programmable resistance memory element includes applying a clamped, known voltage across the memory element so as to establish a fixed current sinking capability thereof; applying a known reference current through a reference leg of a sense amplifier circuit; mirroring the reference current to a data leg of the sense amplifier circuit, the data leg selectively coupled to the memory element; and comparing, with a differential sense amplifier, the value of the known reference current with the current sinking capability of the memory element, based on corresponding node voltages within the data and reference legs; wherein an output of the differential sense amplifier assumes a first logic state whenever the reference current is less than the fixed current sinking capability of the memory element, and assumes a second logic state whenever the reference current exceeds the fixed current sinking capability.

BRIEF DESCRIPTION OF THE DRAWINGS

Referring to the exemplary drawings wherein like elements are numbered alike in the several Figures.

DETAILED DESCRIPTION

Disclosed herein is an apparatus and method for implementing improved precision sensing of PCRAM devices. Briefly stated, a sense amplifier (SA) circuit is configured to accurately measure the resistance of a PCM element (e.g., having a variable resistance from about 1 kΩ to about 10 MΩ) that is selectively coupled between a bit line (BL) node and ground. The voltage at a node in a data leg of the sense amplifier is clamped, and thus a known current is applied through the PCM element coupled to the data leg. The output of a sense amplifier, coupled to both the data leg and a reference leg, sets to a specific state depending on whether a first input voltage of the sense amplifier (also coupled to the data leg) is greater or less than a second input voltage of the sense amplifier (which is a clamped voltage in the reference leg). A known, selected reference current generated in the reference leg is mirrored to the data leg such that the first input voltage of the sense amplifier only matches the second input voltage of the sense amplifier when the fixed current through the PCM element equals the selected reference current. In this case, the resistance of the PCM element is then therefore determined by the clamped (known) voltage in the data leg and the known current applied through the PCM element (which matches the selected reference current).

Figure 1:
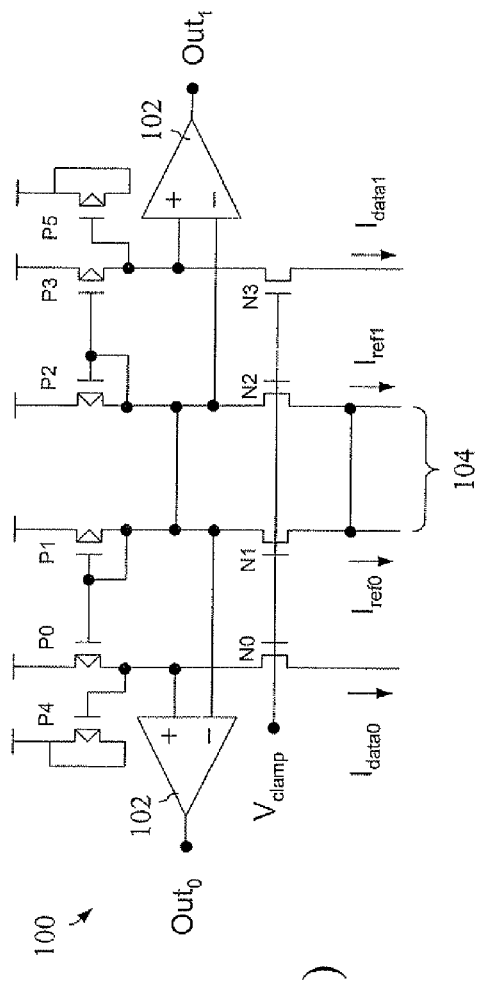
FIG. 1 is a schematic diagram of an existing sense amplifier device design in which a pair of amplifiers each share a common reference bit line pair.

Referring initially to FIG. 1, there is shown a schematic diagram of an existing sense amplifier device 100, in which a pair of sense amplifiers 102 share a common reference bit line pair 104. The reference bit line currents, $I_{ref0}$ and $I_{ref1}$, are generated by respective coupling to a first reference data cell (not shown) set to a logic 0 resistance state and a second data cell (not shown) set to a logic 1 resistance state. The reference currents are averaged to create an ideal reference current (midway between the values of the logic 0 and logic 1 data currents) that is respectively mirrored through current mirror load devices P1 and P2. As a result, a reference voltage (based on the average of the reference currents) is applied to the negative input terminals of the differential sense amplifiers 102. The voltages at the positive terminals correspond to the data bit line currents $I_{data0}$ and $I_{data1}$. The differential amplifiers 102, in turn, generate the SA output signals $Out_0$ and $Out_1$.

Both the data legs for the two sense amplifiers 102 and the reference bit line pair are coupled to data/reference cells through activation of a plurality of NFET devices N0 through N3. The gates of the NFETs are coupled to a source follower, clamped voltage source ($V_{clamp}$). Although the currents through the common reference bit line pair 104 are each set by an active fixed resistance element, the voltage across at the source terminals of N0-N3 will vary with voltage threshold ($V_t$) and current variations. As also illustrated in FIG. 1, PFET devices device P4 and P5 are added to respectively balance the gate capacitance of P1 and P2 present on the reference (negative) terminal of the sense amplifiers. Ultimately, the sense amplifier 100 of FIG. 1 is not specifically configured for determining the actual cell resistance since the applied voltage to the cell and current passing through the cell is not known or tightly controlled.

Figure 2:
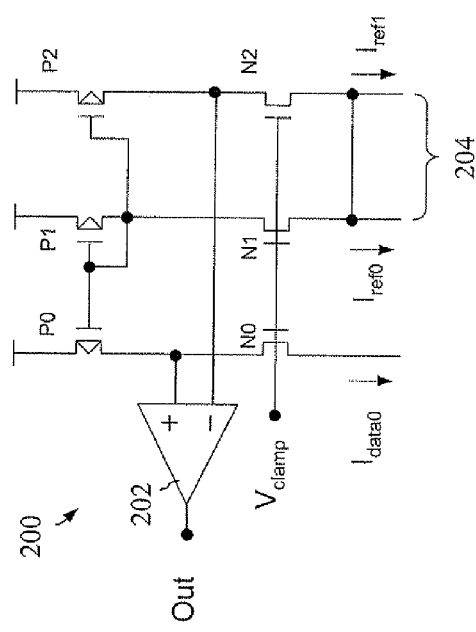
FIG. 2 is a schematic diagram of another existing sense amplifier device design in which a single amplifier utilizes a common reference bit line pair.

In contrast, FIG. 2 is a schematic diagram of another existing sense amplifier device 200 in which a single amplifier 202 utilizes a common reference bit line pair 204. Similar to the device of FIG. 1, the reference bit line currents, $I_{ref0}$ and $I_{ref1}$, are generated by respective coupling to a first reference data cell (not shown) set to a logic 0 resistance state and a second data cell (not shown) set to a logic 1 resistance state. In this case, the reference currents are averaged to create an ideal reference current (midway between the values of the logic 0 and logic 1 data currents) that is mirrored through current mirror load device P1.

It will be noted that the sense amplifier device 200 of FIG. 2 has better capacitance balance at the input terminals of the differential sense amplifier 202, since only PFET device P1 is in diode configuration, and the reference legs 204 are shorted only on the source sides of N1 and N2 only. The source follower clamp gate voltage ($V_{clamp}$) is fixed across the gates of NFETs N0-N2, but as in the case of the amplifier device of FIG. 1, the voltage across the source terminals of N0-N2 will vary with $V_t$ and current variations. Similarly, the sense amplifier device 200 of FIG. 2 is not suitable for determining the cell resistance since the applied voltage to the cell and current passing through the cell is not known or tightly controlled.

Figure 3:
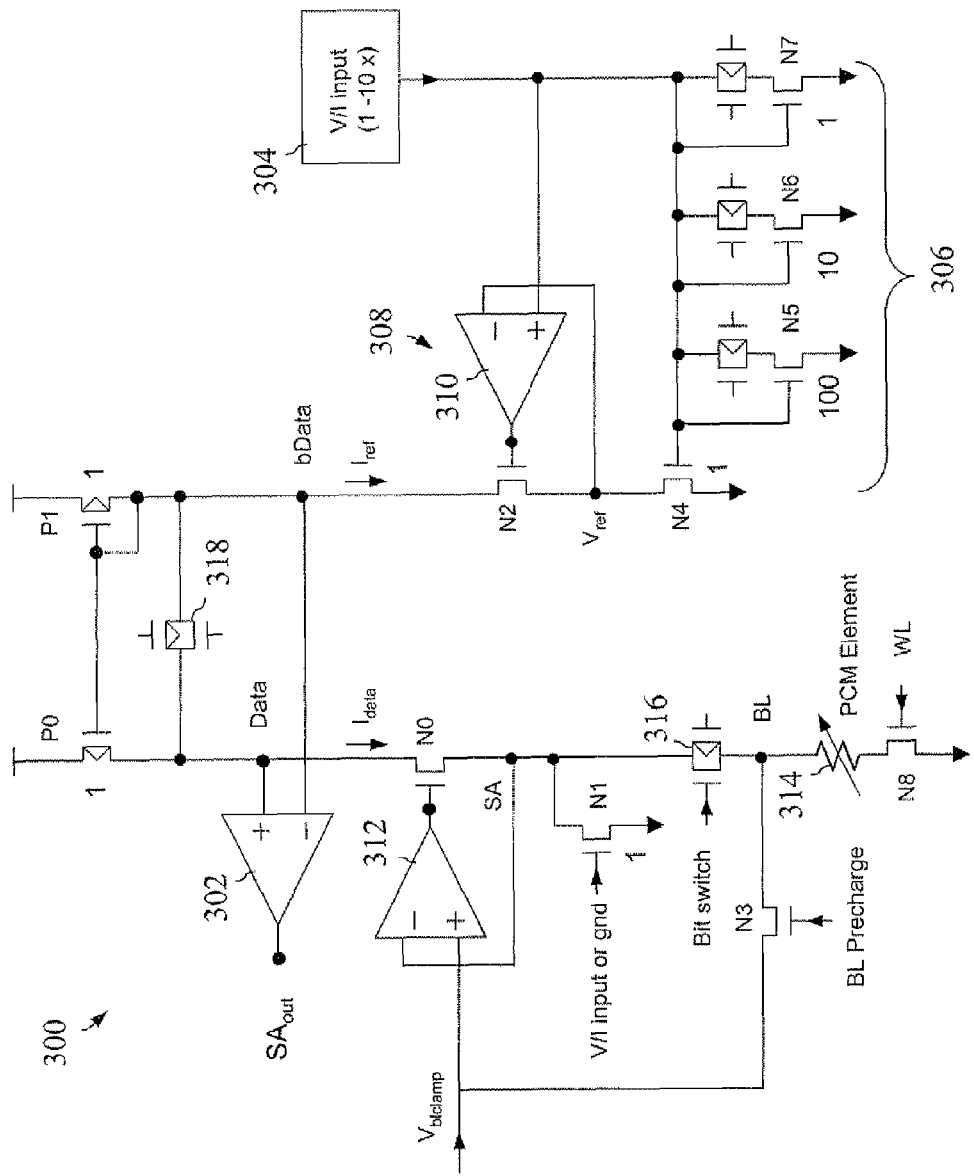
FIG. 3 is a schematic diagram of a precision sense amplifier circuit configured to accurately measure the resistance of a memory device such as a PCM element, in accordance with an embodiment of the invention.

Therefore, in accordance with an embodiment of the invention, FIG. 3 is a schematic diagram of a precision sense amplifier circuit 300 configured to accurately measure the resistance of a memory device, such as a PCM element for example. As shown in FIG. 3, the precision sense amplifier circuit 300 (in addition to differential sense amplifier 302) includes: a voltage-to-current (V/I) input source 304, a programmable gain current mirror 306 (NFETs N4-N7) for the V/I input source 304, an enhanced output impedance stage 308 (NFET N2 and op amp 310) for tightly controlling the magnitude of reference current and to clamp the voltage (V/I input) at the node $V_{ref}$ in the reference leg, a PFET current mirror (P0, P1) for mirroring the reference current in the data leg.

Additionally, the data leg of the precision sense amplifier circuit 300 further includes: a clamping device having a source follower N0 with op amp 312 feedback to clamp the voltage at node "SA" in the data leg, a precharge biasing device N1 to sink mirrored data leg current prior to coupling the sense amplifier 302 to PCM element 314 through a bitswitch 316, an equalizing switch 318 for selectively shorting the data and reference legs, a bitline precharge switch N3 for precharging the voltage at node "BL" of the PCM element 314 to the clamped voltage, and an NFET N8 controlled by a wordline (WL) signal for selectively coupling the PCM element 314 to ground to allow data current to flow therethrough.

As will first be noted, the precision sense amplifier circuit 300 of the exemplary embodiment utilizes a single reference leg, as opposed to the reference leg pair of the devices in FIGS. 1 and 2. Because of the large range of possible resistance values associated with PCM devices (again, from about 1 kΩ to about 10 MΩ), the adjustability of the V/I input source 304 is roughly an order of magnitude. By way of example, for an input range of about 0.3-3.0 volts, the corresponding output of the V/I input source 304 may range from about 30 µA-300 µA. In lieu of a V/I converter, a band gap reference circuit may also be used to provide adjustable input current. Further, the programmable gain current mirror 306 is configured to provide an attenuation of up to, for example, 100 times the magnitude of the current provided by the V/I input source 304. In operation, the gain (attenuation) would be controlled by selectively activating one of N5 (×100), N6 (×10) or N7 (×1), wherein selection of N7 mirrors the full value of the current provided by the V/I input source 304, selection of N6 mirrors $1/10^{th}$ the value of the current provided by the V/I input source 304, and selection of N5 mirrors $1/100^{th}$ the value of the current provided by the V/I input source 304. As such, the total adjustability of the reference current generated by the combination of the V/I input source 304 and the programmable gain current mirror 306 is at least three orders of magnitude in the illustrated embodiment.

In order to tightly control the selected current generated in the reference leg, the enhanced output impedance stage 308 has the non-inverting terminal (+) of op amp 310 coupled to the output of the V/I input source 304. The inverting terminal (−) of op amp 310 is connected to the reference node $V_{ref}$ in the reference leg, and the output of op amp 310 controls the gate of source follower NFET N2. Thus, the enhanced output impedance stage 308 creates a tightly controlled reference current through active $V_{ds}$ control of N2.

The established, known reference current ($I_{ref}$) is mirrored to the data leg through current mirror P0, P1. Furthermore, since the voltage at the sense amp node SA in the data leg is actively clamped and controlled through the source follower N0 and feedback from op amp 312, a known voltage is established across the PCM element 314 once it is coupled to the sense amplifier circuitry through N8 and bitswitch 316.

In addition to providing controlled reference currents and voltages, the precision sense amplifier circuit 300 further includes various precharging devices to establish a proper DC operating point before the bitswitch opens, thereby promoting rapid signal development. For example, the equalizing switch 318 shorts the data and reference legs together at a point common to the differential sense amplifier 302, thus initially equalizing the voltages on node Data and bData (reference). Also, the bitline precharge device N3 is used to set the PCM voltage (on node BL) to the same voltage (i.e., $V_{blclamp}$) as the clamped SA node for rapid signal development once the bitswitch 316 couples the PCM element 314 to the data leg of the sense amplifier. In addition to voltage equalization (Data/bData) and bitline (BL) clamp voltage bias during precharge, the reference current mirrored into the data leg has a precharge path to ground through precharge current bias device N1. The gate of N1 is selectively coupled to either ground (during a read operation) or the output of the V/I input source 304 (during precharge). By sizing N1 and N4 to have substantially the same conductive strengths and by tying the gate of N1 to the same voltage as N4 during precharge, both N1 and N4 comprise matching load resistances for the reference and data currents when the device 300 is in a precharge state.

Figure 4:
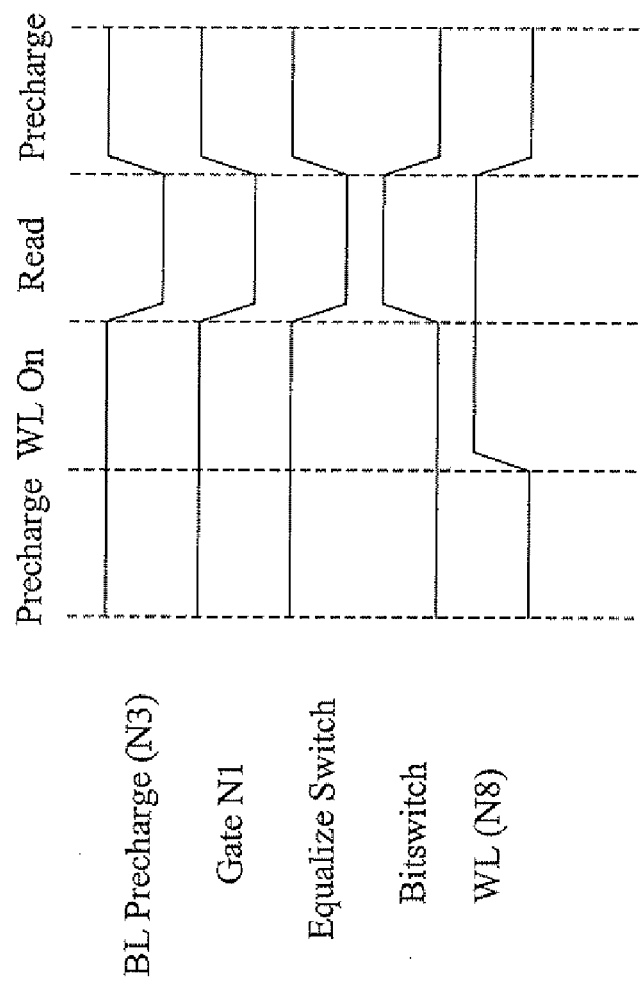
FIG. 4 is a timing diagram illustrating the operation of the sense amplifier circuit of FIG. 3.

The AC operation of the precision sense amplifier circuit 300 will be further understood with reference to the timing diagram of FIG. 4. Initially, in a precharge mode, NFET N3 is activated to equalize the voltages at nodes SA and BL, with the voltage at node SA clamped by $V_{blclamp}$. Concurrently, NFET N1 is activated to set the data node (Data) operating point wherein the $I_{data}$ load current is equal to $I_{ref}$. The bitswitch 316 is deactivated so as to isolate the PCM element 314 from node SA in the data leg, and the equalizing switch 318 is activated to equalize the inputs (Data, bData) to the sense amplifier 302. At this point, the wordline (gate of N8) has not yet been activated.

Then, the wordline WL is activated, coupling the PCM element 314 to ground while the precharge devices are still activated. During the read phase, the SA node current and bitline precharge devices (N1, N3) are deactivated, as well as the equalizing switch 318. Concurrently, the bitswitch 316 is activated to couple the PCM element 314 to the clamped SA node.

Because the clamped SA node establishes a specific current sinking capability for the PCM element 314 (i.e., the clamped SA voltage divided by the resistance of the PCM element 314), the voltage at the Data node (i.e., the data leg input to the sense amplifier 302) will remain undisturbed only if this fixed current sinking capability happens to match the selected value of $I_{ref}$ that is mirrored into the data leg. Otherwise, the voltage at the Data node will either rise or fall with respect to the voltage at the bData node in the reference leg. Because the gate and source terminals of P0 and P1 are identically biased, and since the drain terminal of P1 (i.e., bData) is effectively clamped, the voltage at the drain terminal of P0 (i.e., Data) will therefore correspondingly rise or fall when the fixed current sinking capability of the PCM element does not match $I_{ref}$.

By way of a simple numerical example (which is not to be construed in any limiting sense), it is assumed that the unknown resistance value of the PCM element 314 sought to be determined is 1 kΩ. It is further assumed that the value of the clamped voltage at node SA (and precharged on BL) is 1.0 volt. Therefore, the PCM element 314 must sink 1 mA of current upon being coupled to ground by N8. It is further assumed that the values of the V/I input source 304 and the programmable gain current mirror 306 are selected such that $I_{ref}$ is initially equal to 0.5 mA. During precharge, this 0.5 mA of reference current is mirrored in the data leg and sunk by activated device N1 (configured to match N4). At this point, the voltages at Data and bData are also equalized, and the output of the sense amplifier 302 ($SA_{out}$) is indeterminate.

However, once the PCM element 314 is coupled between the clamped SA node and ground, P0 can no longer maintain the mirrored value of $I_{ref}$ (0.5 mA), but instead must now adapt to source a full 1 mA as dictated by the clamped voltage at SA and the PCM resistance. Therefore, the voltage at Data will drop below that of bData and the output of the sense amplifier will flip to a first logic state. Stated another way, the $V_{ds}$ of P0 changes (increases) to accommodate the sinking current of the PCM element 314 that is higher than the initial current source capability of P0.

Conversely, it will now be assumed that the values of the V/I input source 304 and the programmable gain current mirror 306 are selected such that $I_{ref}$ is equal to 1.5 mA (which exceeds the amount of current sunk by the PCM element 314). Again, during precharge, this 1.5 mA of reference current is mirrored in the data leg and sunk by activated device N1. Further, the voltages at Data and bData are again equalized, and the output of the sense amplifier 302 ($SA_{out}$) is indeterminate. Now, when the PCM element is coupled between the clamped SA node and ground, P0 can no longer maintain the mirrored value of $I_{ref}$ (1.5 mA), but instead is now limited to sourcing only 1 mA of current as dictated by the clamped voltage at SA and the PCM resistance. Therefore, the voltage at Data will rise above that of bData (i.e., decrease the $V_{ds}$ of P0) and the output of the sense amplifier will flip to the opposite logic state.

Accordingly, by varying the value of the reference current and determining the value thereof that matches the current sink capability of the PCM element (i.e., the value above and below which the logic state of the sense amplifier output toggles), the value of the PCM element is determined since the value of the reference current and the clamped voltage at node SA are both known. In addition, the combination of the variable V/I input source 304 and the programmable gain current mirror 306 allows for sufficient granularity and range of applied currents so as to be able to accurately determine the resistance of a PCM element over a wide range of possible values.

It will also be appreciated that, in addition to specific resistance value measurement, the architecture of the circuit 300 could also be used for a comparative read function during an actual memory device operation. For example, the V/I input source 304 and the programmable gain current mirror 306 may be replaced by a reference resistance (set between a logic 0 PCM resistance value and a logic 1 PCM resistance value) in the reference leg. The other device features (e.g., precharging devices) may still be used for rapid signal development. In addition, it will further be appreciated that the resistance measuring technique may also be used for other types of memory elements including, but not limited to MRAM devices or other types of programmable resistance devices.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A precision sense amplifier apparatus, comprising:
a current source configured to introduce an adjustable reference current through a reference leg;
a current mirror configured to mirror the reference current to a data leg, the data leg selectively coupled to a programmable resistance memory element;
an active clamping device coupled to the data leg, and configured to clamp a fixed voltage across the memory element, thereby establishing a fixed current sinking capability thereof; and
a differential sense amplifier having a first input thereof coupled to the data leg and a second input thereof coupled to the reference leg;
wherein an output of the differential sense amplifier assumes a first logic state whenever the reference current is less than the fixed current sinking capability of the memory element, and assumes a second logic state whenever the reference current exceeds the fixed current sinking capability.

2. The apparatus of claim 1, wherein the current source further comprises:
an adjustable voltage to current input source;
a programmable gain current mirror coupled to the adjustable voltage to current input source; and
an output impedance stage coupled to the voltage to current input source and the reference leg, the output impedance configured for precise control of the reference current.

3. The apparatus of claim 2, wherein the output impedance stage further comprises:
an op amp having a non-inverting terminal coupled to the voltage to current input source and an inverting terminal coupled to the reference leg; and
a source follower coupled to the reference leg and to an output of the op amp.

4. The apparatus of claim 1, wherein the active clamping device further comprises:
an op amp having a non-inverting terminal coupled to a fixed clamp voltage and an inverting terminal coupled to the data leg; and
a source follower coupled to the data leg and to an output of the op amp, the source follower coupled between the memory element and the first input of the differential amplifier.

5. The apparatus of claim 1, further comprising a bitline precharge device configured to selectively precharge a bitline associated with memory element to the fixed voltage during a precharge mode of operation.

6. The apparatus of claim 1, further comprising a precharge current bias device configured to selectively introduce a current discharge path for mirrored reference current in the data leg during a precharge mode of operation.

7. The apparatus of claim 6, wherein the precharge current bias device comprises an NFET having a gate terminal selectively coupled between ground and the current source.

8. The apparatus of claim 1, further comprising an equalizing switch configured to selectively short the first and second inputs of the differential sense amplifier during a precharge mode of operation.

9. The apparatus of claim 1, wherein the programmable resistance memory element comprises a phase change memory (PCM) element.

10. The apparatus of claim 7, wherein the NFET of the precharge current bias device is sized so as to substantially match a conductive strength of another NFET included the reference leg.

11. A precision sense amplifier apparatus for measuring the resistance of a phase change memory (PCM) element, comprising:
an adjustable voltage to current input source;
a first current mirror coupled to the adjustable voltage to current input source, the first current mirror having a programmable gain;
an output impedance stage coupled to the voltage to current input source and a reference leg, the output impedance configured for precise control of an adjustable reference current introduced through a reference leg;
a second current mirror configured to mirror the reference current to a data leg, the data leg selectively coupled to the PCM element;

an active clamping device coupled to the data leg, and configured to clamp a fixed voltage across the memory element, thereby establishing a fixed current sinking capability thereof; and a differential sense amplifier having a first input thereof coupled to the data leg and a second input thereof coupled to the reference leg;

wherein an output of the differential sense amplifier assumes a first logic state whenever the reference current is less than the fixed current sinking capability of the memory element, and assumes a second logic state whenever the reference current exceeds the fixed current sinking capability.

12. The apparatus of claim 11, wherein the output impedance stage further comprises:

an op amp having a non-inverting terminal coupled to the voltage to current input source and an inverting terminal coupled to the reference leg; and a source follower coupled to the reference leg and to an output of the op amp.

13. The apparatus of claim 12, wherein the active clamping device further comprises:

an op amp having a non-inverting terminal coupled to a fixed clamp voltage and an inverting terminal coupled to the data leg; and a source follower coupled to the data leg and to an output of the op amp, the source follower coupled between the memory element and the first input of the differential amplifier.

14. The apparatus of claim 13, further comprising:

a bitline precharge device configured to selectively precharge a bitline associated with the memory element to the fixed voltage during a precharge mode of operation;

a precharge current bias device configured to selectively introduce a current discharge path for mirrored reference current in the data leg during the precharge mode of operation; and an equalizing switch configured to selectively short the first and second inputs of the differential sense amplifier during the precharge mode of operation.

15. The apparatus of claim 14, wherein the precharge current device bias device comprises an NFET having a gate terminal selectively coupled between ground and the voltage to current input source.

16. The apparatus of claim 11, wherein:

the voltage to current input source has an adjustability of at least one order of magnitude; and the programmable gain first current mirror has an adjustability of at least two orders of magnitude.

17. A method of determining the resistance of a programmable resistance memory element, comprising:

applying a clamped, known voltage across the memory element so as to establish a fixed current sinking capability thereof;

applying a known reference current through a reference leg of a sense amplifier circuit;

mirroring the reference current to a data leg of the sense amplifier circuit, the data leg selectively coupled to the memory element; and comparing, with a differential sense amplifier, the value of the known reference current with the current sinking capability of the memory element, based on corresponding node voltages within the data and reference legs;

wherein an output of the differential sense amplifier assumes a first logic state whenever the reference current is less than the fixed current sinking capability of the memory element, and assumes a second logic state whenever the reference current exceeds the fixed current sinking capability.

18. The method of claim 17, further comprising adjusting the value of the known reference current until the output of the differential sense amplifier changes from one of the first and second logic states to the other of the first and second logic states, thereby determining a specific value of the known reference current that matches the fixed current sinking capability of the memory element, wherein the resistance of a programmable resistance memory element is determined from the clamped, known voltage thereacross and the value of the fixed current sinking capability of the memory element.

19. The method of claim 18, further comprising, in a precharge mode of operation:

precharging a bitline associated with the memory element to the clamped, known voltage;

introducing a current discharge path for mirrored reference current in the data leg while the memory element is decoupled from the data leg; and shorting the first and second inputs of the differential sense amplifier.

20. The method of claim 18, wherein the known reference current is generated by an adjustable voltage to current input source, a first current mirror coupled to the adjustable voltage to current input source, the first current mirror having a programmable gain, and an output impedance stage coupled to the voltage to current input source and the reference leg.

21. The method of claim 18, wherein the clamped, known voltage is implemented by an op amp having a non-inverting terminal coupled to a fixed clamp voltage and an inverting terminal coupled to the data leg, and a source follower coupled to the data leg and to an output of the op amp, the source follower coupled between the memory element and a first input of the differential amplifier in the data leg.

* * * * *